(12) United States Patent
Tomono et al.

(10) Patent No.: US 11,068,624 B2
(45) Date of Patent: Jul. 20, 2021

(54) THREE-DIMENSIONAL MODEL GENERATING METHOD, THREE-DIMENSIONAL MODEL GENERATING SYSTEM, AND THREE-DIMENSIONAL MODEL GENERATING PROGRAM

(71) Applicant: MITUTOYO CORPORATION, Kanagawa (JP)

(72) Inventors: Yasushi Tomono, Tokyo (JP); Takanori Asamizu, Hokkaido (JP)

(73) Assignee: MITUTOYO CORPORATION, Kanagawa (JP)

( * ) Notice: Subject to any disclaimer, the term of this patent is extended or adjusted under 35 U.S.C. 154(b) by 379 days.

(21) Appl. No.: 14/832,329

(22) Filed: Aug. 21, 2015

(65) Prior Publication Data
US 2016/0055267 A1 Feb. 25, 2016

(30) Foreign Application Priority Data

Aug. 25, 2014 (JP) .............................. JP2014-170654

(51) Int. Cl.
*G06F 30/17* (2020.01)
*G06F 30/13* (2020.01)
*G06F 30/15* (2020.01)

(52) U.S. Cl.
CPC .............. *G06F 30/17* (2020.01); *G06F 30/13* (2020.01); *G06F 30/15* (2020.01)

(58) Field of Classification Search
CPC .. G06F 17/50; G06F 17/5004; G06F 17/5086; G06F 17/20; G06F 30/20;
(Continued)

(56) References Cited

U.S. PATENT DOCUMENTS 5,781,450 A * 7/1998 Glasson ................. G01B 5/008
33/504
6,502,056 B2  12/2002 Kikuchi et al.
(Continued)

FOREIGN PATENT DOCUMENTS

JP 2001-241941 9/2001
JP 2003-345839 12/2003

OTHER PUBLICATIONS

Woo, H., et al. "A new segmentation method for point cloud data." International Journal of Machine Tools and Manufacture 42.2 (2002): 167-178. (Year: 2002).*
(Continued)

*Primary Examiner* — Omar F Fernandez Rivas
*Assistant Examiner* — Joshua E. Jensen
(74) *Attorney, Agent, or Firm* — Greenblum & Bernstein, P.L.C.

(57) ABSTRACT

A three-dimensional model generating method selecting a predetermined plane element defining a three-dimensional model element using measurement data, which includes measurement point group data obtained by measuring a measured object, a type of a plane element, and geometric values of the plane element; obtaining a condition required for generating a three-dimensional model element; generating the three-dimensional model element using the selected plane element and the obtained condition; and generating the three-dimensional model of the measured object using one or a plurality of three-dimensional model elements. A calculator displays a three-dimensional image corresponding to the measured object as well as a list of at least the structural elements which, of the plane elements included in the measurement data, configure the three-dimensional image.

10 Claims, 13 Drawing Sheets

(58) Field of Classification Search
CPC .......... G06F 30/17; G06F 30/00; G06F 30/15; G06F 30/13; G06T 15/00; G06T 17/00; G06T 17/10; G06T 2210/56
See application file for complete search history.

(56) References Cited

U.S. PATENT DOCUMENTS

| | | | | |
|---|---|---|---|---|
| 7,013,191 | B2* | 3/2006 | Rubbert | G16H 50/50 700/98 |
| 2013/0181983 | A1* | 7/2013 | Kitamura | G01B 11/24 345/419 |
| 2015/0310604 | A1* | 10/2015 | Lim | G06T 7/0004 382/141 |
| 2016/0012638 | A1* | 1/2016 | Skrobanski | G06T 17/00 345/420 |

OTHER PUBLICATIONS

Cooper, Oliver Daniel. Robust generation of 3D models from video footage of urban scenes. Diss. University of Bristol, 2005. 113-151 (Year: 2005).*
Wang, Jun, et al. "A framework for 3D model reconstruction in reverse engineering." Computers & Industrial Engineering 63.4 (2012): 1189-1200. (Year: 2012).*
U.S. Appl. No. 14/832,217 to Yasushi Tomono et al., filed Aug. 21, 2015.

* cited by examiner

| Meas Result (Measurement Result) | Solid Modeling |
|---|---|
| Plane_0<br>Plane_1<br>Plane_2<br>Plane_3<br>Plane_4<br>Plane_5<br>Plane_6<br>Plane_7<br>Plane_8<br>Plane_9<br>Plane_10 | |

| L | G |
|---|---|
| List View | 3D View |

THREE-DIMENSIONAL MODEL GENERATING METHOD, THREE-DIMENSIONAL MODEL GENERATING SYSTEM, AND THREE-DIMENSIONAL MODEL GENERATING PROGRAM

CROSS-REFERENCE TO RELATED APPLICATIONS

The present application claims priority under 35 U.S.C. § 119 of Japanese Application No. 2014-170654, filed on Aug. 25, 2014, the disclosure of which is expressly incorporated by reference herein in its entirety.

BACKGROUND OF THE INVENTION

1. Field of the Invention

The present invention relates to a three-dimensional model generating method, a three-dimensional model generating system, and a three-dimensional model generating program generating a three-dimensional model in a CAD system using measurement data obtained by measuring a measured object with a coordinate measuring device.

2. Description of Related Art

Conventionally, as an example of a reverse engineering method or a simple product design method, a technology is known in which a three-dimensional model is automatically generated in a CAD system using measurement data obtained by measuring a measured object with a coordinate measuring device. Technology disclosed by Japanese Patent Laid-open Publication No. 2003-345839, for example, is configured such that data for plane elements representing surfaces of a measured object is created using measurement data (point group data) obtained by measuring the measured object, the plane elements are connected and compound plane element data representing linking surfaces is created, and a three-dimensional solid model is generated using a space enclosed by the compound plane element data.

However, in the above-described conventional three-dimensional model generating method, due to a measurement error when measuring the measured object with the coordinate measuring apparatus or a conversion error in converting from measurement data to plane element data, a situation may arise in which positions connecting the plane element data are offset and unable to form a connection, making it difficult to generate a three-dimensional model having a desired shape and accurate dimensions.

Conventionally, this has been addressed by performing a process (closing process) in which a boundary line between plane element data elements is manually or automatically selected and closed by performing a merge process, or by performing a process which posits that all the generated plane element data elements are closed and automatically creates a closed solid model directly from all of the plane element data. Therefore, in some cases a shape of the generated three-dimensional model may differ greatly from the shape of the actual measured object, requiring significant amounts of time for subsequent correction work.

In order to resolve the above-noted situation, the present invention provides a three-dimensional model generating method, a three-dimensional model generating system, and a three-dimensional model generating program capable of readily generating a three-dimensional model having a desired shape and accurate dimensions based on measurement data.

SUMMARY OF THE INVENTION

A three-dimensional model generating method according to one aspect of the present invention utilizes a calculator generating a three-dimensional model based on measurement data, which includes measurement point group data obtained by measuring a measured object, a type of a plane element, and geometric values of the plane element. The calculator includes a three-dimensional model element generator generating a three-dimensional model element representing a shape of at least a portion of the three-dimensional model based on the measurement data using a predetermined method, the three-dimensional model element being defined by a plane element and a predetermined condition; and a three-dimensional model generator generating a three-dimensional model using one or a plurality of three-dimensional model elements. In addition, the calculator displays a three-dimensional image corresponding to the measured object as well as a list of at least the plane elements which, of the plane elements included in the measurement data, correspond to each structural element configuring the three-dimensional image.

In the three-dimensional model generating method according to this aspect, one or a plurality of three-dimensional model elements are generated by selecting an appropriate plane element included in the measurement data, and a three-dimensional model of the measured object is generated from the three-dimensional model elements. In addition, the calculator displays the three-dimensional image corresponding to the measured object as well as the list of at least the plane elements which, of the plane elements included in the measurement data, correspond to each structural element configuring the three-dimensional image. Accordingly, a user can ascertain a general position on the measured object and a rough shape of each structural element using the three-dimensional image, and can precisely ascertain the plane element corresponding to each structural element using the list. Accordingly, the user can accurately ascertain the position of each plane element on the measured object. Thus, a three-dimensional model can be readily generated having a desired shape and accurate dimensions based on the measurement data.

In another aspect of the present invention, the calculator displays a three-dimensional image of the plane elements as the three-dimensional image, and displays a list of the plane elements as the list.

In the three-dimensional model generating method according to this aspect, the calculator displays the three-dimensional image of the plane elements as well as the list of the plane elements. Accordingly, the user can ascertain a general position on the measured object and a rough shape of each plane element using the three-dimensional image, and can precisely differentiate each plane element using the list. Accordingly, the user can accurately ascertain the position of each plane element on the measured object, and can appropriately generate or correct the three-dimensional model elements based on this. Thus, a three-dimensional model can be readily generated having a desired shape and accurate dimensions based on the measurement data.

In another aspect of the present invention, the calculator displays a three-dimensional image of the three-dimensional model as the three-dimensional image, and displays a list of the three-dimensional model elements used to generate the three-dimensional model and the plane elements used when generating the three-dimensional model elements as the list.

In the three-dimensional model generating method according to this aspect, in addition to the three-dimensional image of the generated three-dimensional model, the list of the three-dimensional model elements used to generate the three-dimensional image and the plane elements defining the three-dimensional model elements is also displayed. Accordingly, the user can verify the validity of the generated three-dimensional model elements by checking the list as to which three-dimensional model element was generated based on which plane element, and can in some cases make corrections. Thus, a three-dimensional model can be readily generated having a desired shape and accurate dimensions based on the measurement data.

In another aspect of the present invention, in a case where a plane element not used in generating the three-dimensional model is present, the calculator displays a three-dimensional image with a three-dimensional image of the unused plane element superimposed on the three-dimensional image of the three-dimensional model.

According to this aspect, in a case where the measured object has more than a certain degree of complexity, or in a case where the plane elements are comparatively small within the overall three-dimensional image, for example, loss or misinterpretation of the unused plane element can be prevented. Thus, a three-dimensional model can be more readily generated having a desired shape and accurate dimensions based on the measurement data.

In another aspect of the present invention, the list displays the plane element defining the three-dimensional model element as well as the predetermined condition defining the three-dimensional model element.

According to this aspect, using the list, the user can check which three-dimensional model element has been generated based on which plane element, and can also confirm the nature of the parameters used to generate the three-dimensional model element. Accordingly, the user can better verify the validity of the generated three-dimensional model elements, and can in some cases make corrections. Thus, a three-dimensional model can be more readily generated having a desired shape and accurate dimensions based on the measurement data.

In another aspect of the present invention, when one of a predetermined structural element in the three-dimensional image and a corresponding structural element in the list is selected, the other of these two is displayed in a different format than other structural elements.

According to this aspect, in a case where the measured object has more than a certain degree of complexity, or in a case where the plane elements are comparatively small within the overall three-dimensional image, for example, a portion to be verified can be selected on the three-dimensional image and detailed information for the portion can be checked. Thus, a three-dimensional model can be more readily generated having a desired shape and accurate dimensions based on the measurement data.

In another aspect of the present invention, the calculator further includes an error corrector correcting an inclination of a plane element in a case where an angle error is equal to or less than a predetermined size when the plane element is compared to a predetermined plane or line. The calculator displays a structural element of the three-dimensional image corresponding to the plane element having the corrected inclination in a different format than the other structural elements when displaying the three-dimensional image, and displays the structural element corresponding to the plane element having the corrected inclination in a different format than the other structural elements on the list.

According to this aspect, the plane element having the corrected inclination can be favorably ascertained, and can also be restored to an original form when inclination correction is not appropriate. Accordingly, in a case where the measured object has more than a certain degree of complexity, or where the plane elements are comparatively small in the overall three-dimensional image, automatic correction can be carried out to a favorable degree while preventing unintentional correction of inclination of a plane element, and thus a three-dimensional model can be more readily generated having a desired shape and accurate dimensions based on the measurement data.

In another aspect of the present invention, the calculator further includes a first three-dimensional model generator, which obtains information for intersections between plane elements and contour information for each plane element from the plane elements and automatically generates a first three-dimensional model. The calculator also displays the first three-dimensional model.

According to this aspect, the first three-dimensional model is generated automatically based on measurement data and is displayed. The first three-dimensional model automatically generated in this way may, for example, have a shape that differs from that of the measured object in only one area. In some cases, such a difference in shape can be discovered comparatively easily by visual confirmation at this stage. Thus, the user can compare the shapes of the automatically generated first three-dimensional model and the measured object and correct the first three-dimensional model as appropriate using the three-dimensional model elements, and thus a second three-dimensional model can be readily generated having a desired shape and accurate dimensions based on the measurement data.

A three-dimensional model generating system according to another aspect of the present invention includes a calculator generating a three-dimensional model based on measurement data, which includes measurement point group data obtained by measuring a measured object, a type of a plane element, and geometric values of the plane element. The calculator includes a three-dimensional model element generator generating a three-dimensional model element representing a shape of at least a portion of the three-dimensional model based on the measurement data using a predetermined method, the three-dimensional model element being defined by a plane element and a predetermined condition; and a three-dimensional model generator generating a three-dimensional model using one or a plurality of three-dimensional model elements. In addition, the calculator displays a three-dimensional image corresponding to the measured object as well as a list of the plane elements which correspond to each structural element configuring the three-dimensional image.

A three-dimensional model generating program according to another aspect of the present invention utilizes a calculator and generates a three-dimensional model based on measurement data, which includes measurement point group data obtained by measuring a measured object, a type of a plane element, and geometric values of the plane element. The three-dimensional model generating program includes a three-dimensional model element generator generating a three-dimensional model element representing a shape of at least a portion of the three-dimensional model based on the measurement data using a predetermined method, the three-dimensional model element being defined by a plane element and a predetermined condition; and a three-dimensional model generator generating a three-dimensional model using one or a plurality of three-dimensional model elements. In addition, the three-dimensional model generating program causes the calculator to display a three-dimensional image corresponding to the measured object as well as a list of the plane elements which correspond to each structural element configuring the three-dimensional image.

According to the present invention, a three-dimensional model can be readily generated having a desired shape and accurate dimensions based on measurement data.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice.

Embodiments of the present invention are described in detail below with reference to the drawings.

First Embodiment

Figure 1:
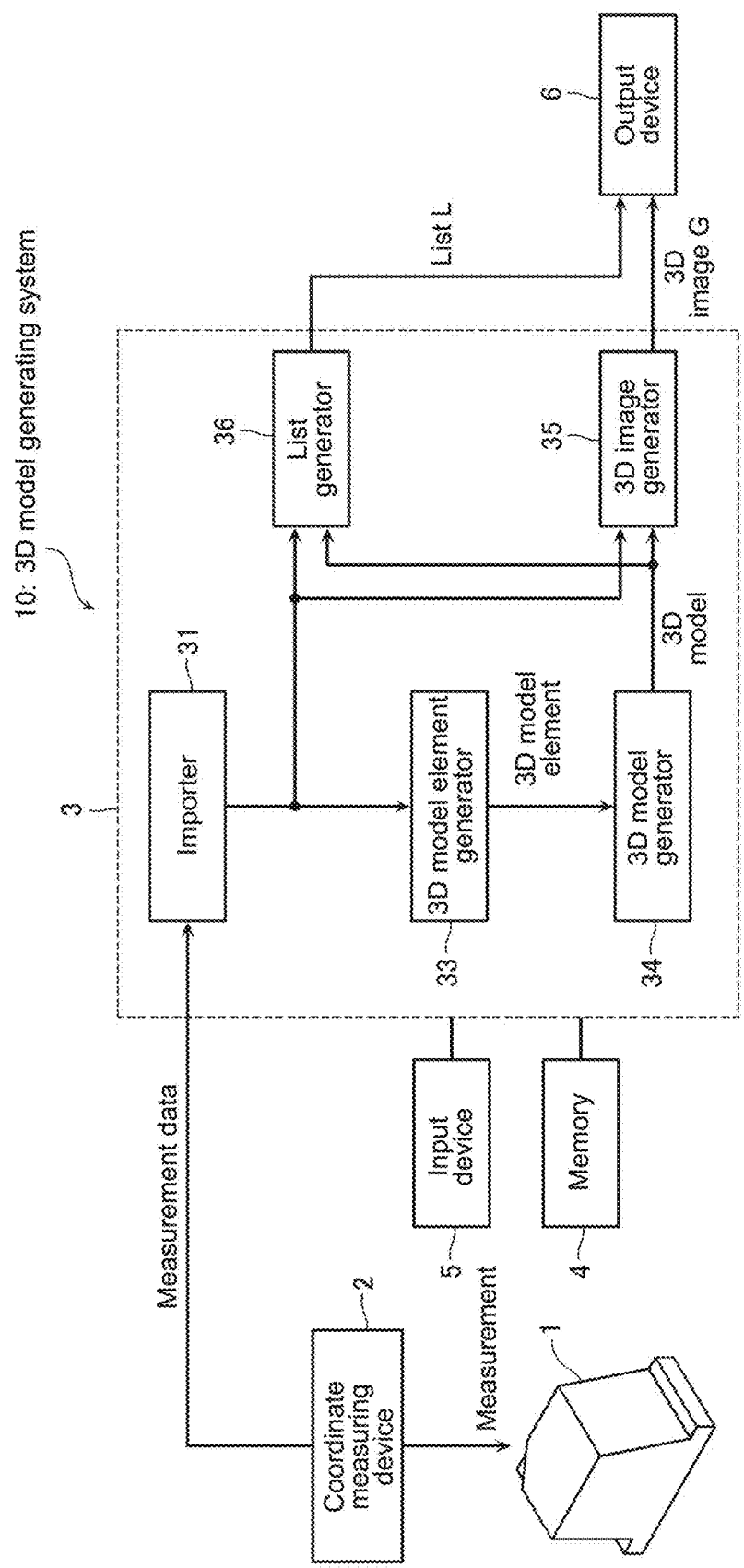
FIG. 1 is a block diagram of a three-dimensional model generating system according to a first embodiment of the present invention.

FIG. 1 is a block diagram of a three-dimensional model generating system 10 according to a first embodiment of the present invention. The three-dimensional model generating system 10 according to the present embodiment obtains measurement data from a coordinate measuring device 2, which measures a measured object 1, and generates a three-dimensional model based on CAD data, for example. The three-dimensional model generating system 10 constitutes a portion of a CAD system, for example. In the present embodiment, a solid model is generated as the three-dimensional model; however, the three-dimensional model is not limited to a solid model and may also be generated as a surface model or a wire model.

As shown in FIG. 1, the three-dimensional model generating system 10 achieves various functions using a computer apparatus and a three-dimensional model generating program executed by the computer apparatus. The computer apparatus is configured to include a calculator 3, which generates the three-dimensional model based on the measurement data obtained by measuring the measured object 1; a memory 4 connected to the calculator 3 and storing the three-dimensional model generating program; an input device 5 connected to the calculator 3 and operating the three-dimensional model generating program according to the present embodiment, performing input of various parameters, and the like; and an output device 6 outputting the three-dimensional model generated by the calculator 3. The calculator 3 is a CPU or microprocessor, for example, and performs various calculations. A keyboard, mouse, touchscreen panel, or the like may be employed as the input device 5, and a display screen, projector, printer, or the like may be employed as the output device 6.

Figure 2:
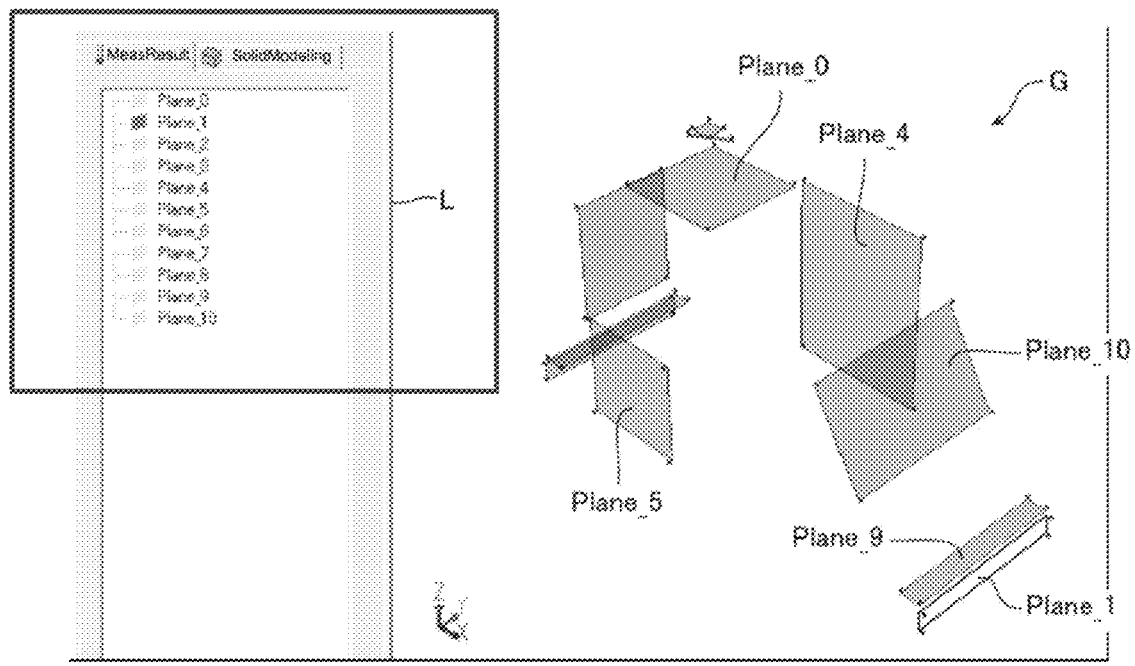
FIG. 2 illustrates an exemplary graphic output to an output device.
Figure 3:
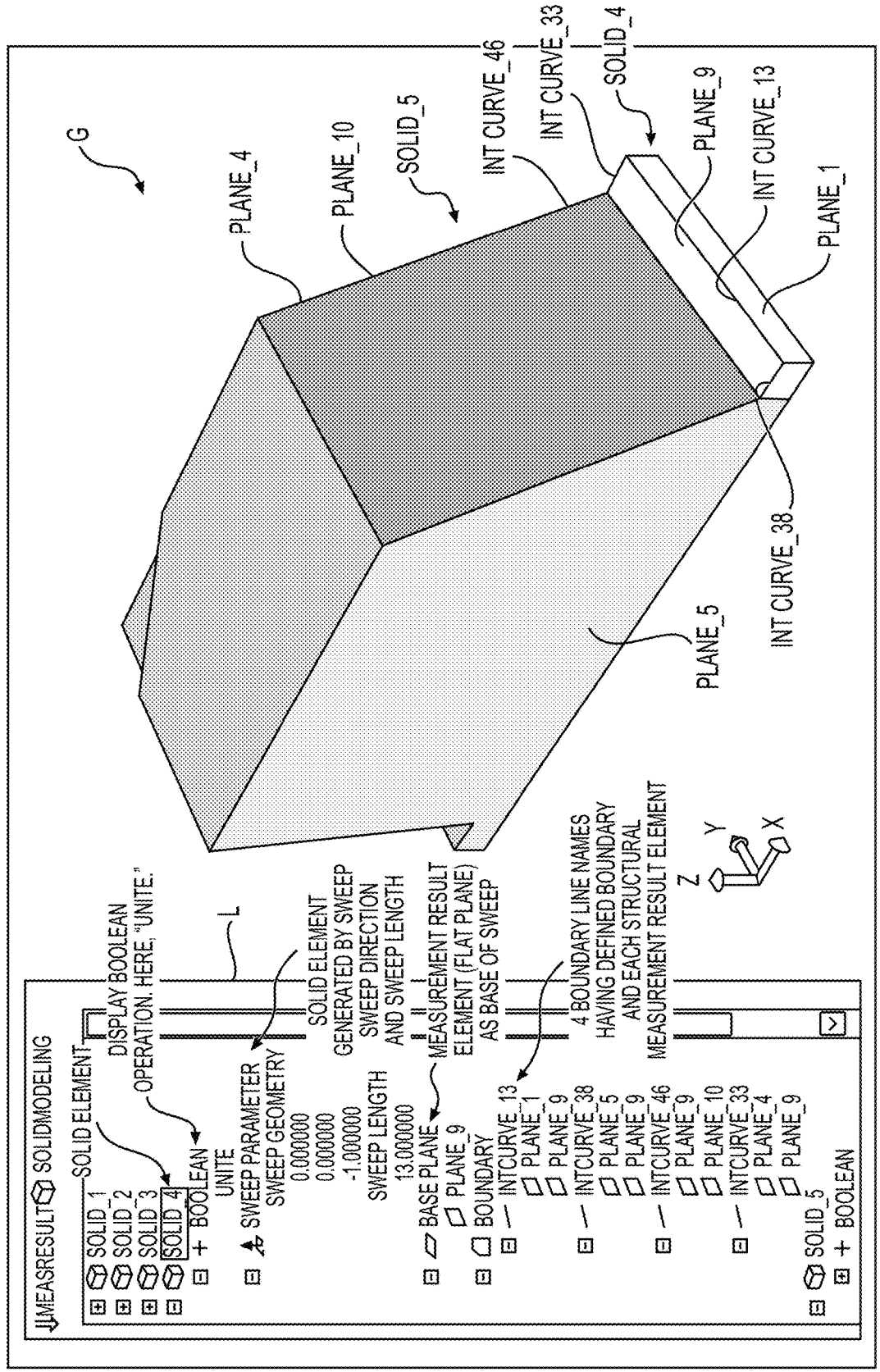
FIG. 3 illustrates another exemplary graphic output to the output device.

As shown in FIG. 1, the calculator 3 includes various features in addition to a predetermined three-dimensional model generating program, such as an importer 31 obtaining the measurement data from the coordinate measuring device 2; a three-dimensional model element generator 33 generating a three-dimensional model element that represents, using a predetermined method, a shape of at least a portion of a three-dimensional model based on the measurement data obtained by the importer 31; a three-dimensional model generator 34 generating a three-dimensional model using one or a plurality of the three-dimensional model elements; a three-dimensional image generator 35 generating a three-dimensional image G corresponding to the measured object 1 and outputting the three-dimensional image G to the output device 6; and a list generator 36 generating an image of a list L of structural elements configuring the three-dimensional image G and outputting the list L to the output device 6. As shown in FIG. 2, in a case where a three-dimensional image G having a plurality of plane elements is generated by the three-dimensional image generator 35, for example, the list generator 36 generates a list L of plane elements included by the three-dimensional image generator 35. In addition, as shown in FIG. 3, in a case where a three-dimensional image G of a three-dimensional model is generated by the three-dimensional image generator 35, for example, the list generator 36 generates a list L of three-dimensional model elements configuring the three-dimensional model.

As shown in FIG. 1, an object having any shape, including a free-form surface, may be selected as the measured object 1; however, an object having a surface shape that can be defined by a CAD system as an analytic quadric surface is preferred. In other words, the surface shape of the measured object 1 may be configured by a combination of any of, for example, a point element; a straight line element; a curved line element such as a circle or ellipse; and a plane element such as a flat plane, a cylindrical plane, a conical plane, a spherical plane, or a toroid plane. Here, as shown in FIG. 1, an example is posited having substantially a box shape, in which a front plane and back plane incline in one direction, a lip is formed at a bottom portion of the front and back planes, and a back left portion of a top plane is formed to be lower than other planes.

The measurement data output from the coordinate measuring device 2 includes measurement point group data, types of geometric elements, and geometric values of the geometric elements. The measurement point group data is a data set of measured coordinates of one or a plurality of measurement points of a surface of the measured object 1. The type of geometric element is data indicating a category such as a point element, a straight line element, and a plane element for, e.g., a point, a straight line, a flat surface, a circle, an ellipse, a cylindrical surface, a conical surface, a spherical surface, or a toroid surface. The type of geometric element may also be data obtained by an operator providing individual instructions when measurement point group data is obtained during coordinate measurement, or may be data obtained by an automatic determination by a coordinate measuring device in response to a distribution status of measurement point group data (see, for example, Japanese Patent Laid-open Publication No. 2001-241941). In addition, the geometric value of the geometric element is data such as reference position coordinates, orientation, length, or diameter of the geometric element, as estimated from the measurement point group data. For example, the geometric values may include, in the case of a straight line element, coordinate values of a reference point, direction, and length; in the case of a flat plane element, coordinate values of a reference point and normal direction; in the case of a circle element, coordinate values of a reference point, a normal direction, and a diameter; and in the case of an ellipse element, coordinate values of a reference point, a normal direction, a major axis direction, a major axis, and a minor axis. The geometric value of the geometric element is found using the type of geometric element and the measurement point group data. For ease of description in the following, the geometric element is a plane element. Furthermore, the measurement data may also include data related to a direction in which the plane element is obtained (direction in which the measured object 1 lies relative to the plane element), such as a probe contact direction or an image capture direction, for example.

FIG. 2 illustrates an exemplary graphic that is output to the output device 6, and on a left portion of the figure depicts the list L (feature tree) of plane elements included in the measurement data and, on a right portion of the figure, depicts the three-dimensional image G represented by the plane elements. In the example shown in FIG. 2, the plane elements in the measurement data are flat plane elements Plane_0 to Plane_10. Flat plane elements Plane_0 to Plane_10 are plane elements obtained when each flat plane of the measured object 1 is measured. Moreover, as shown in FIG. 2, a breadth (length, width, height, and the like) of each plane element is indeterminate in the measurement data. In this example, the breadth is expressed based on a distribution range of the measurement point group.

In addition, as shown in FIG. 2, for example, when one of a predetermined structural element in the three-dimensional image G (structural element configuring the three-dimensional image G; for example, the plane element Plane_1) and a corresponding structural element in the list L (structural element configuring the list L; for example, a portion reading "Plane_1" or an icon positioned in front of this portion) is selected, the other is displayed in a different format than other structural elements. In the present embodiment, by selecting either one of a plane element in the three-dimensional image G and a corresponding plane element in the list L, a color of the selected plane element is displayed using a different color than other structural elements. For example, when a user clicks on the portion of the list L reading "Plane_1," as shown in FIG. 2, the plane element Plane_1 in the three-dimensional image G is displayed in a different color than the other plane elements Plane_2 to Plane_10.

FIG. 3 illustrates another exemplary graphic output to the output device 6 and, on the right portion of the figure, depicts the generated three-dimensional model and the three-dimensional image G of one (Solid_4) of the plurality of three-dimensional model elements generating the three-dimensional model. Moreover, the list L (feature tree) is shown on the left portion of the figure listing the three-dimensional model elements configuring the three-dimensional model (Solid_1 to Solid_5), the plane elements defining the three-dimensional model elements, and parameters.

As shown in FIG. 3, in the present embodiment, the three-dimensional model is generated by combining a plurality of three-dimensional model elements. As noted above, the three-dimensional model elements represent a shape of at least a portion of the three-dimensional model, and are defined by plane elements included in measured elements and by predetermined parameters. In addition, the three-dimensional model elements include a plurality of types of elements, depending on a representation method of the three-dimensional model. FIG. 3 illustrates a sweep element Solid_4. A sweep element represents a three-dimensional shape using a locus for a case where a predetermined flat planar shape is displaced in a predetermined direction. As shown on the left in FIG. 3, the sweep element may be expressed by, for example, a sweep base plane defining a plane occupied by the flat planar shape; a closed contour set (boundary) defining a shape of the flat planar shape on the sweep base plane; a direction (sweep geometry) in which the flat planar shape is displaced; and a distance (sweep length) over which the sweep occurs.

As shown in FIG. 3, in the present embodiment, the sweep base plane is selected from the plane elements included in the measurement data. In addition, the closed contour set (boundary) is expressed by a plurality of contour lines (IntCurve_13, IntCurve_38, IntCurve_46, and IntCurve_33) and intersection points, and the contour lines are expressed by lines of intersection between the plane elements included in the measurement data.

As shown in FIG. 3, other parameters may also exist as parameters defining the sweep element. In the present embodiment, a Boolean operation element (boolean) is provided as such a parameter. For example, as shown in FIG. 3, in a case where Boolean operation elements are united, the three-dimensional model is created in a space defined by the sweep base plane, the closed contour set, the direction in which the sweep occurs, and the distance over which the sweep occurs. Meanwhile, in a case where the Boolean operation elements are subtracted, the three-dimensional model is not created at a portion overlapping with the space occupied by the other three-dimensional model elements.

In addition, as shown in FIG. 3, when one of a predetermined structural element in the three-dimensional image G (for example, the three-dimensional model element Solid_4) and a corresponding structural element in the list L is selected, for example, the other is displayed in a different format than other structural elements. For example, in the present embodiment, by selecting either one of a three-dimensional model element in the three-dimensional image G and a three-dimensional model element in the list L, a color of the selected element is displayed in both the three-dimensional image G and the list L using a different color than other three-dimensional model elements.

Figure 4:
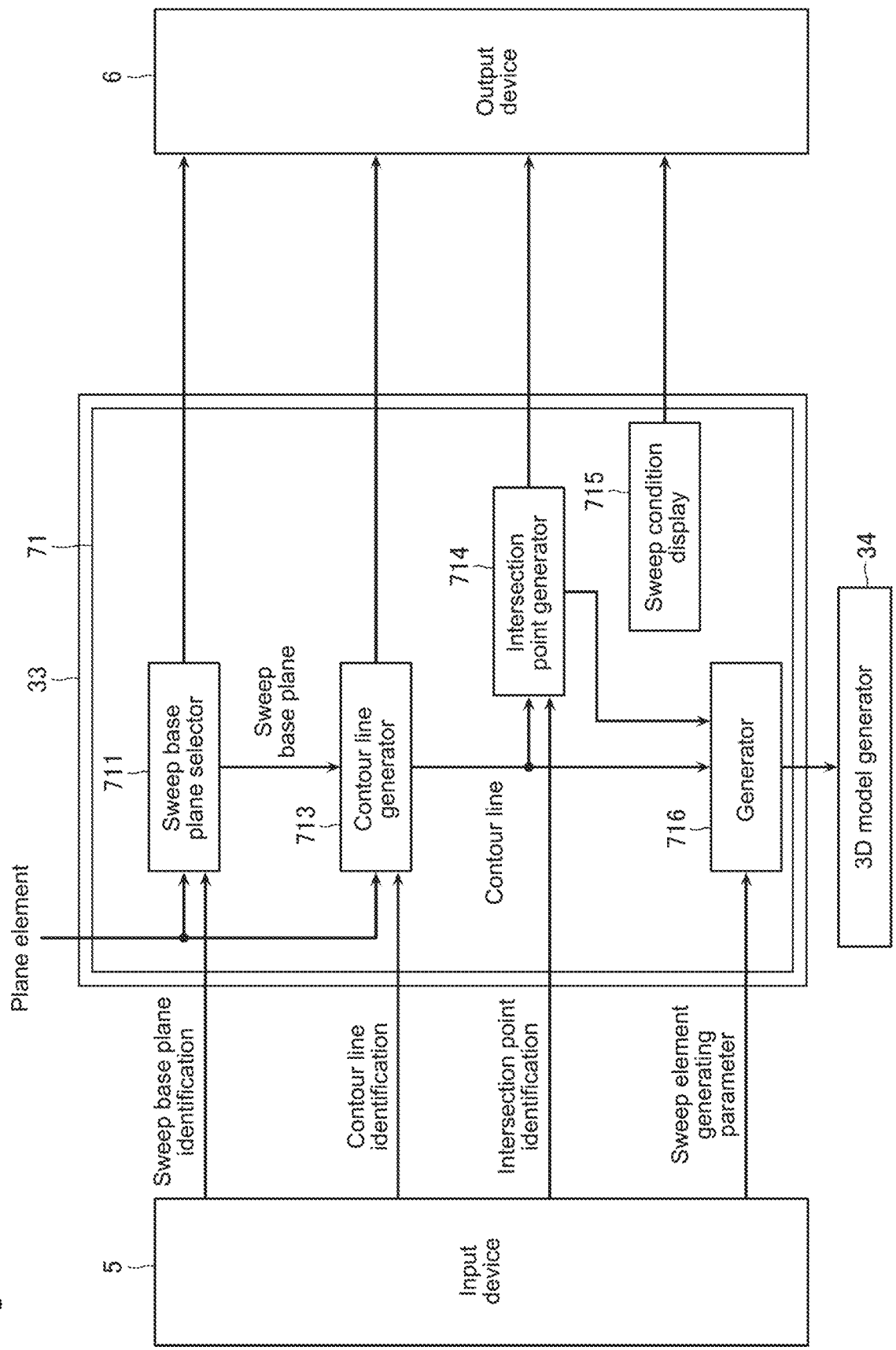
FIG. 4 is a block diagram of a configuration of a three-dimensional model element generator according to the first embodiment of the present invention.

Next, a sweep element generator 71 within the three-dimensional model element generator 33 according to the present embodiment is described with reference to FIG. 4. FIG. 4 is a block diagram illustrating a portion of a configuration of the three-dimensional model element generator 33 according to the present embodiment. As shown in FIG. 4, the three-dimensional model element generator 33 according to the present embodiment includes the sweep element generator 71 generating sweep elements.

Within the sweep element generator 71, a sweep base plane selector 711 selects a plane element in the measurement data as the sweep base plane. The sweep base plane selector 711 may also create a list of candidate flat plane elements for the sweep base plane from the measurement data and output the list to the output device 6, then select the sweep base plane in accordance with input from the input device 5.

Within the sweep element generator 71, a contour line generator 713 selects, from the plane elements in the measurement data, the selected sweep base plane as well as a second plane element defining the contour line and generates the contour line using the line of intersection between the sweep base plane and the second plane element. The contour line generator 713 may also create a list of lines of intersection between the sweep base plane and second plane elements and output the list to the output device 6, then select the contour lines sequentially in accordance with input from the input device 5.

Within the sweep element generator 71, an intersection point generator 714 generates an intersection point defining a contour of a closed contour set based on a point of intersection between contour lines. The intersection point generator 714 may also create a list of intersection points defining the contour of the closed contour set and output the list to the output device 6, then select the intersection points sequentially in accordance with input from the input device 5.

Within the sweep element generator 71, a sweep condition display 715 displays, on the output device 6, conditions required to generate a sweep element. The sweep condition display 715 may also output, to the output device 6, an input form to which conditions required to generate a sweep element are input, and sequentially obtain the sweep element generation parameters in accordance with input from the input device 5.

Within the sweep element generator 71, a generator 716 generates a sweep element using the generated contour lines, intersection points, and sweep element generating parameters that are input using the input device 5.

In the three-dimensional model generating method according to the present embodiment, one or a plurality of three-dimensional model elements are generated by selecting an appropriate plane element included in the measurement data, and a three-dimensional model of the measured object is generated from the three-dimensional model elements. In addition, as shown in FIGS. 1 to 3, the calculator 3 displays the three-dimensional image G corresponding to the measured object as well as the list L of at least the plane elements which, of the plane elements included in the measurement data, correspond to each structural element configuring the three-dimensional image G. Accordingly, the user can ascertain a general position on the measured object 1 and a rough shape of the plane elements corresponding to each structural element using the three-dimensional image G, and can precisely ascertain each structural element using the list L. Accordingly, the user can accurately ascertain the position of each plane element on the measured object 1. Thus, a three-dimensional model can be readily generated having a desired shape and accurate dimensions based on the measurement data.

For example, in a case where the measured object has an extremely complex shape and a large number of structural elements are included within a narrow range, reliably judging a position of each structural element on the measured object 1 simply by looking at the three-dimensional image G may be difficult. In such a case, the position of each structural element on the measured object 1, for example, can be reliably judged by checking each structural element on the list L.

In addition, as shown in FIG. 2, in the three-dimensional model generating method according to the present embodiment, the calculator 3 displays the three-dimensional image G of the plane elements (Plane_0 to Plane_0) as well as the list L of the plane elements. Accordingly, the user can ascertain a general position on the measured object 1 and a rough shape of each plane element using the three-dimensional image G, and can precisely differentiate each plane element using the list L. Accordingly, the user can accurately ascertain the position of each plane element on the measured object 1, and can appropriately generate or correct a three-dimensional model element based on this. Thus, a three-dimensional model can be readily generated having a desired shape and accurate dimensions based on the measurement data.

Furthermore, as shown in FIG. 3, in the three-dimensional model generating method according to the present embodiment, in addition to the three-dimensional image G of the generated three-dimensional model, the three-dimensional model elements used to generate the three-dimensional image G (Solid_1 to Solid_5) and the list L of the plane elements used when generating the three-dimensional model elements are also displayed. Accordingly, the user can verify the validity of the generated three-dimensional model elements by checking the list L as to which three-dimensional model element was generated based on which plane element, and can in some cases make corrections. Thus, a three-dimensional model can be readily generated having a desired shape and accurate dimensions based on the measurement data.

Moreover, as shown in FIG. 3, in the three-dimensional model generating method according to the present embodiment, in addition to the plane elements defining the three-dimensional model elements, the list L also displays predetermined conditions defining the three-dimensional model elements. With this format, using the list L, the user can check which three-dimensional model element has been generated based on which plane element, and can also confirm the nature of the parameters used to generate the three-dimensional model element. Accordingly, the user can better verify the validity of the generated three-dimensional model elements, and can in some cases make corrections. Thus, a three-dimensional model can be readily generated having a desired shape and accurate dimensions based on the measurement data.

Second Embodiment

Figure 5:
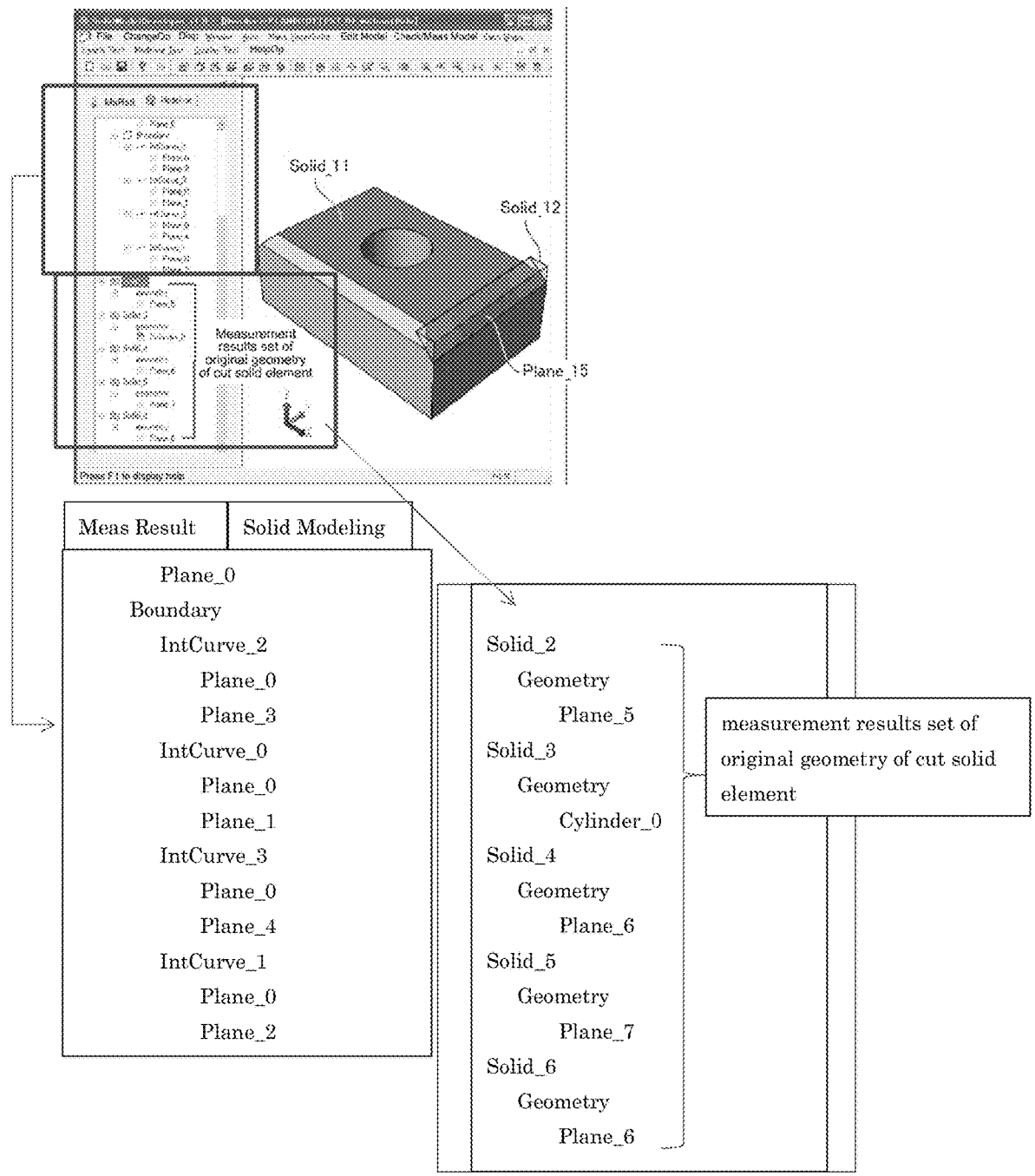
FIG. 5 illustrates another exemplary graphic output to the output device in a second embodiment of the present invention.
Figure 6:
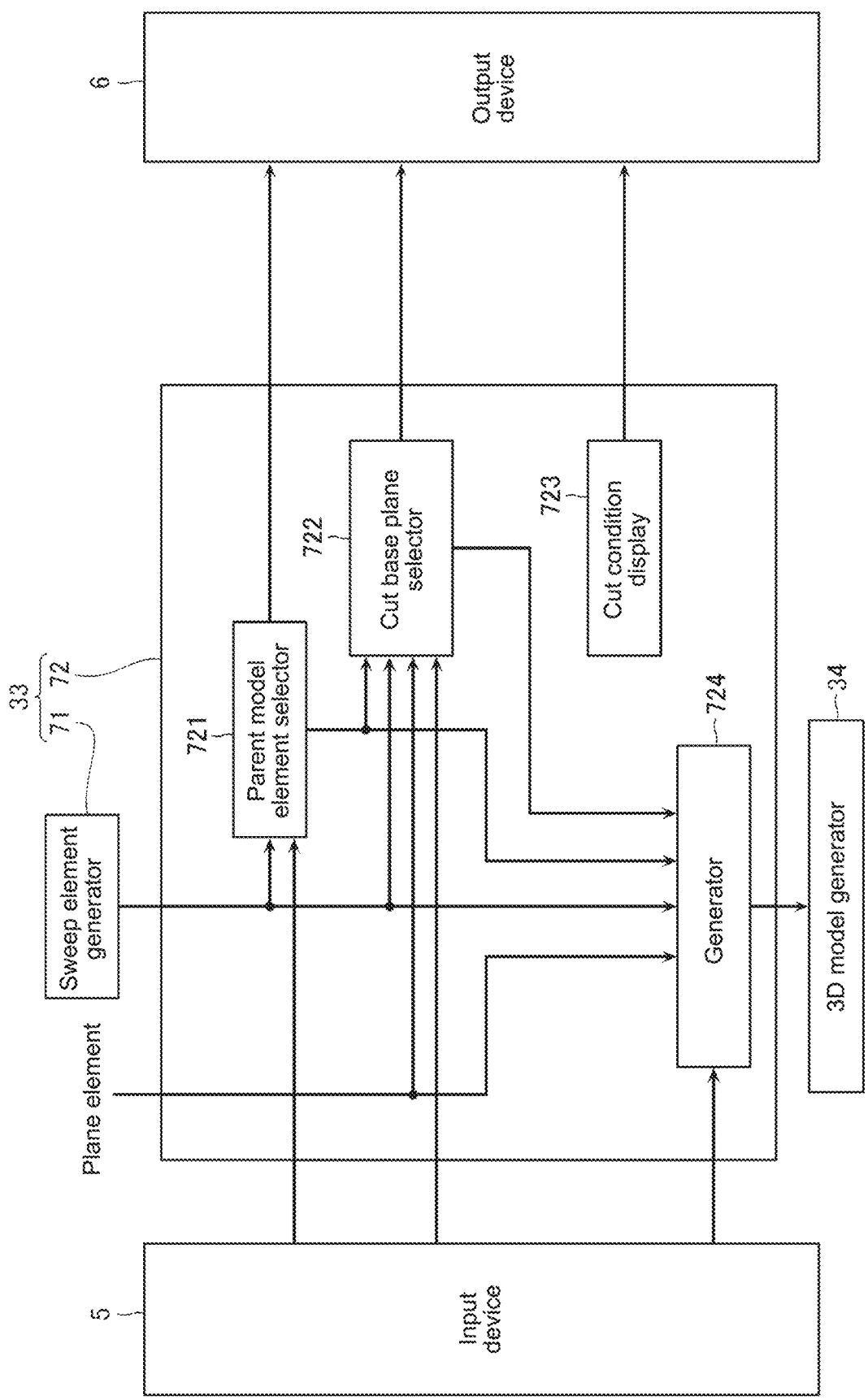
FIG. 6 is a block diagram of a configuration of the three-dimensional model element generator according to the second embodiment of the present invention.

Next, a three-dimensional model generating method according to a second embodiment of the present invention is described with reference to FIGS. 5 and 6. FIG. 5 illustrates another exemplary graphic output to the output device 6 with the three-dimensional model generating method according to the second embodiment of the present invention, and depicts, on the right portion of the figure, the generated three-dimensional model and one of the three-dimensional model elements (here, Solid_12) generating the three-dimensional model. Moreover, a list (feature tree) is shown on the left portion of the figure listing the three-dimensional model elements configuring the three-dimensional model, the plane elements defining the three-dimensional model elements, and parameters. In the following description, portions similar to those of the first embodiment are assigned the same reference numerals, and a description thereof is omitted. In addition, for purposes of description, FIG. 5 depicts measurement data obtained by measuring a measured object having a shape different from that of the first embodiment.

As was described with reference to FIG. 3, an exemplary case was provided for the first embodiment in which a sweep element is used as the three-dimensional model element. As shown in FIG. 5, in the present embodiment, a cut element is used in addition to the sweep element as the three-dimensional model element. The cut element represents a three-dimensional shape by slicing a given three-dimensional shape with a predetermined flat or curved plane. Furthermore, the cut element is expressed by, for example, a parent model element (the three-dimensional shape to be sliced), a cut base plane (geometry) defining a slicing plane of the parent model element, and a cut direction indicating a direction in which the three-dimensional shape is removed after slicing.

As shown in FIG. 5, in the present embodiment, the cut base plane is selected from the plane elements included in the measurement data. In addition, the parent model element may also be a sweep element generated by the sweep element generator 71, for example. In the example shown in FIG. 5, a Solid_11 is selected as a parent model and a plane element Plane_15 is selected as the cut base plane, thereby generating the cut element Solid_12.

Next, a three-dimensional model element generator 33 according to the present embodiment is described with reference to FIG. 6. FIG. 6 is a block diagram illustrating a configuration of the three-dimensional model element generator 33 according to the present embodiment. As shown in FIG. 6, the three-dimensional model element generator 33 according to the present embodiment includes the sweep element generator 71 as well as a cut element generator 72 generating cut elements.

Within the cut element generator 72, a parent model element selector 721 selects a sweep element generated by the sweep element generator 71 as the parent model element. The parent model element selector 721 may also create a list of candidate sweep elements for the parent model element and output the list to the output device 6, then select the parent model element in accordance with input from the input device 5.

Within the cut element generator 72, a cut base plane selector 722 selects, from among the plane elements in the measurement data, a plane element that intersects with the selected parent model element as a cut base plane. The cut base plane selector 722 may also create a list of candidate plane elements for the cut base plane and output the list to the output device 6, then select the cut base plane in accordance with input from the input device 5.

Within the cut element generator 72, a cut condition display 723 displays, on the output device 6, conditions required to generate a cut element. The cut condition display 723 may also create and output to the output device 6 an input form in which the cut direction is designated, and obtain the cut direction based on input from the input device 5.

Within the cut element generator 72, a generator 724 generates a cut element using the selected parent model element, the cut base plane, and cut element generating parameters that are input using the input device 5.

Third Embodiment

Figure 7:
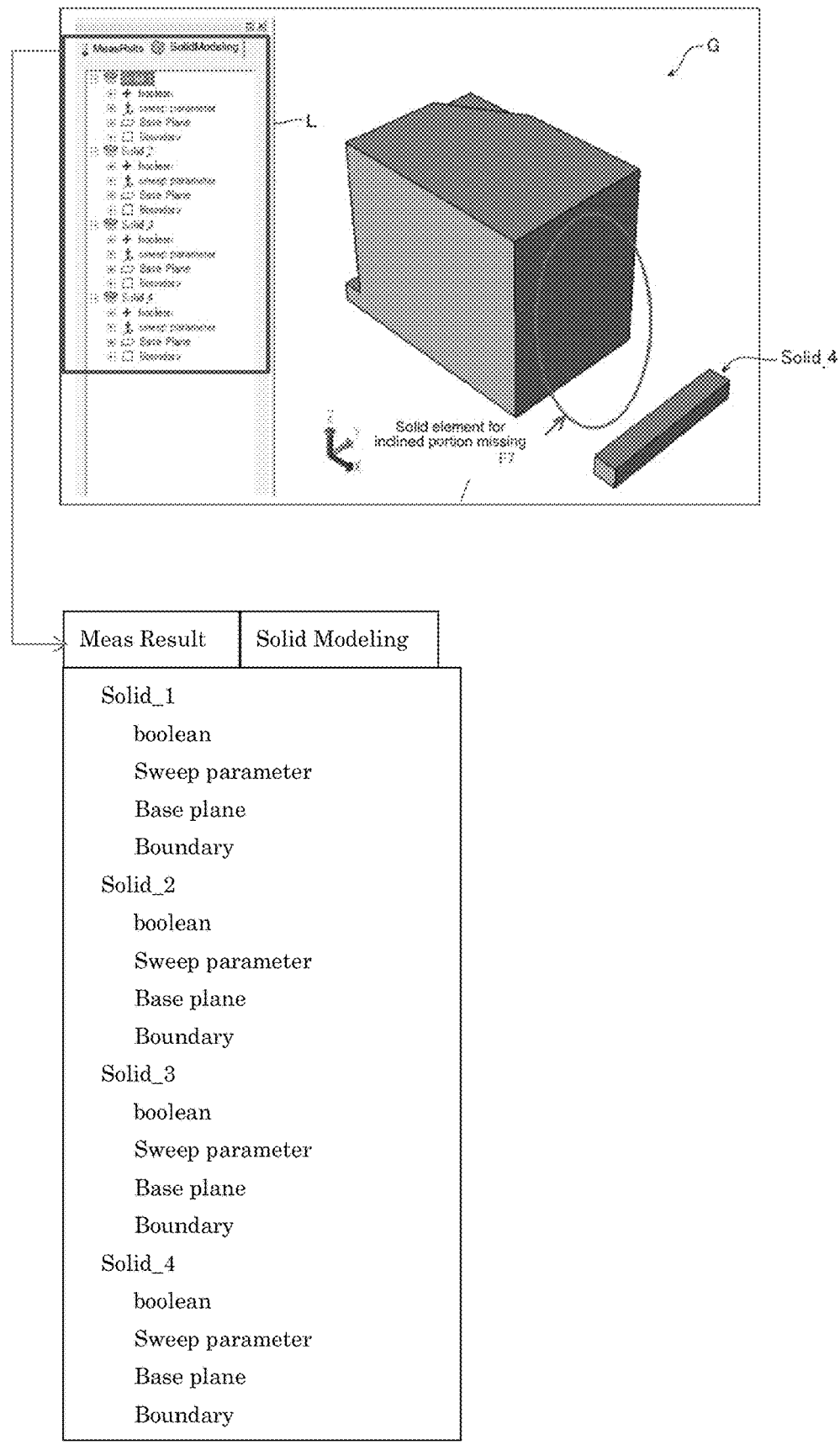
FIG. 7 illustrates another exemplary graphic output to the output device in a three-dimensional model generating method according to a third embodiment of the present invention.
Figure 8:
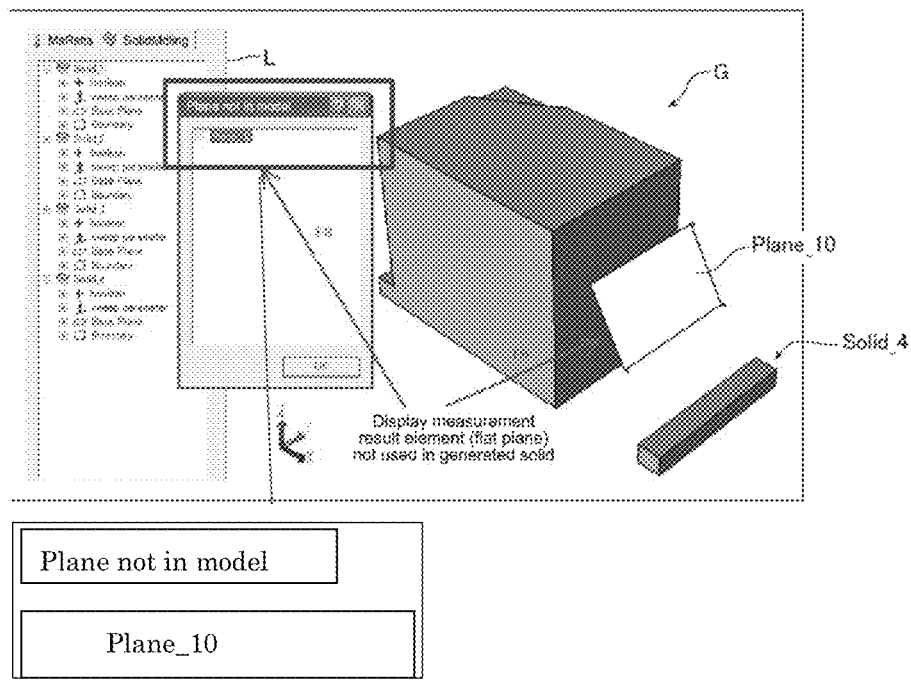
FIG. 8 illustrates another exemplary graphic output to the output device.
Figure 9:
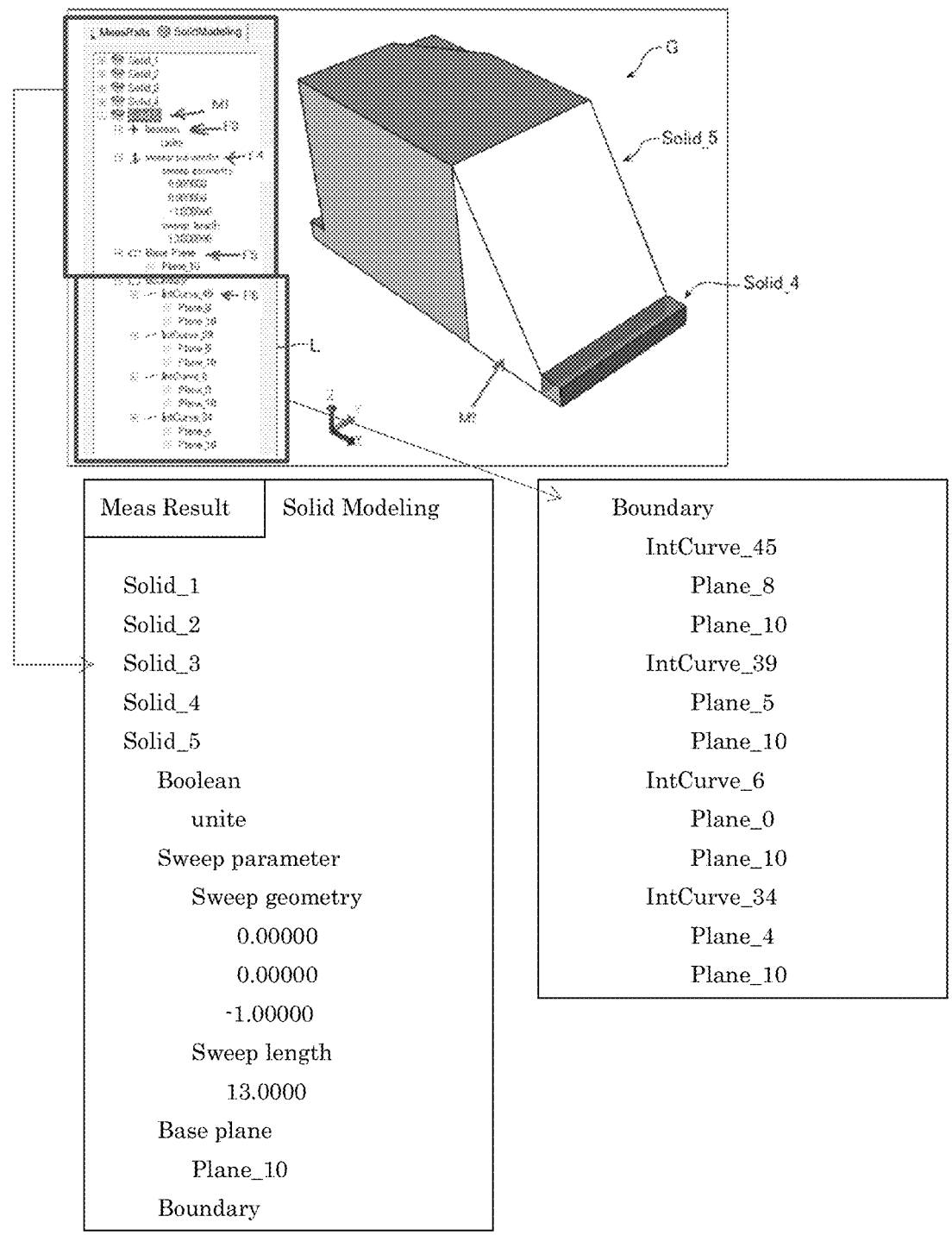
FIG. 9 illustrates another exemplary graphic output to the output device.

Next, a three-dimensional model generating method according to a third embodiment of the present invention is described with reference to FIGS. 7 to 9. FIGS. 7 to 9 illustrate exemplary graphics output to the output device 6, and depict the three-dimensional image G of the generated three-dimensional model on the right portion of the figure. Moreover, the list L is shown on the left portion of the figure listing the three-dimensional model elements configuring the three-dimensional model (Solid_1 to Solid_5), the plane elements defining the three-dimensional model elements, and parameters. In the following description, portions similar to those of the first and second embodiments are assigned the same reference numerals, and a description thereof is omitted.

As shown in FIG. 7, in a case where the three-dimensional model is generated automatically or manually, a situation may arise in which not all of the plane elements obtained during measurement are used, and thus incomplete plane elements may be generated. In such a case, situations may occur in which, for example, the measured object has more than a certain degree of complexity, the plane elements are comparatively small within the overall three-dimensional image, or differences from the measured object 1 are difficult to determine at a glance when visually checking the three-dimensional image G of the three-dimensional model.

In this example, as shown in FIG. 8, in the three-dimensional model generating method according to the present embodiment, in a case where a plane element (Plane_10) not used in generating the three-dimensional model is present, the three-dimensional image G is displayed with the three-dimensional image of the unused plane element superimposed on the three-dimensional image of the three-dimensional model. Accordingly, as shown in FIG. 9, the user can generate a new three-dimensional model element Solid_5 based on the unused plane element Plane_10. In other words, in the three-dimensional model generating method according to the present embodiment, in a case where the measured object has more than a certain degree of complexity, or in a case where the plane elements are comparatively small within the overall three-dimensional image, loss or misinterpretation of the unused plane element can be prevented. Thus, a three-dimensional model can be more readily generated having a desired shape and accurate dimensions based on the measurement data.

Moreover, as shown in FIG. 8, the three-dimensional image of the plane element superimposed on the three-dimensional image of the three-dimensional model may also be displayed in a different format than the three-dimensional image of the three-dimensional model. For example, in the present embodiment, the three-dimensional image of the three-dimensional model and the three-dimensional image of the unused plane element are displayed using different colors.

Fourth Embodiment

Figure 10:
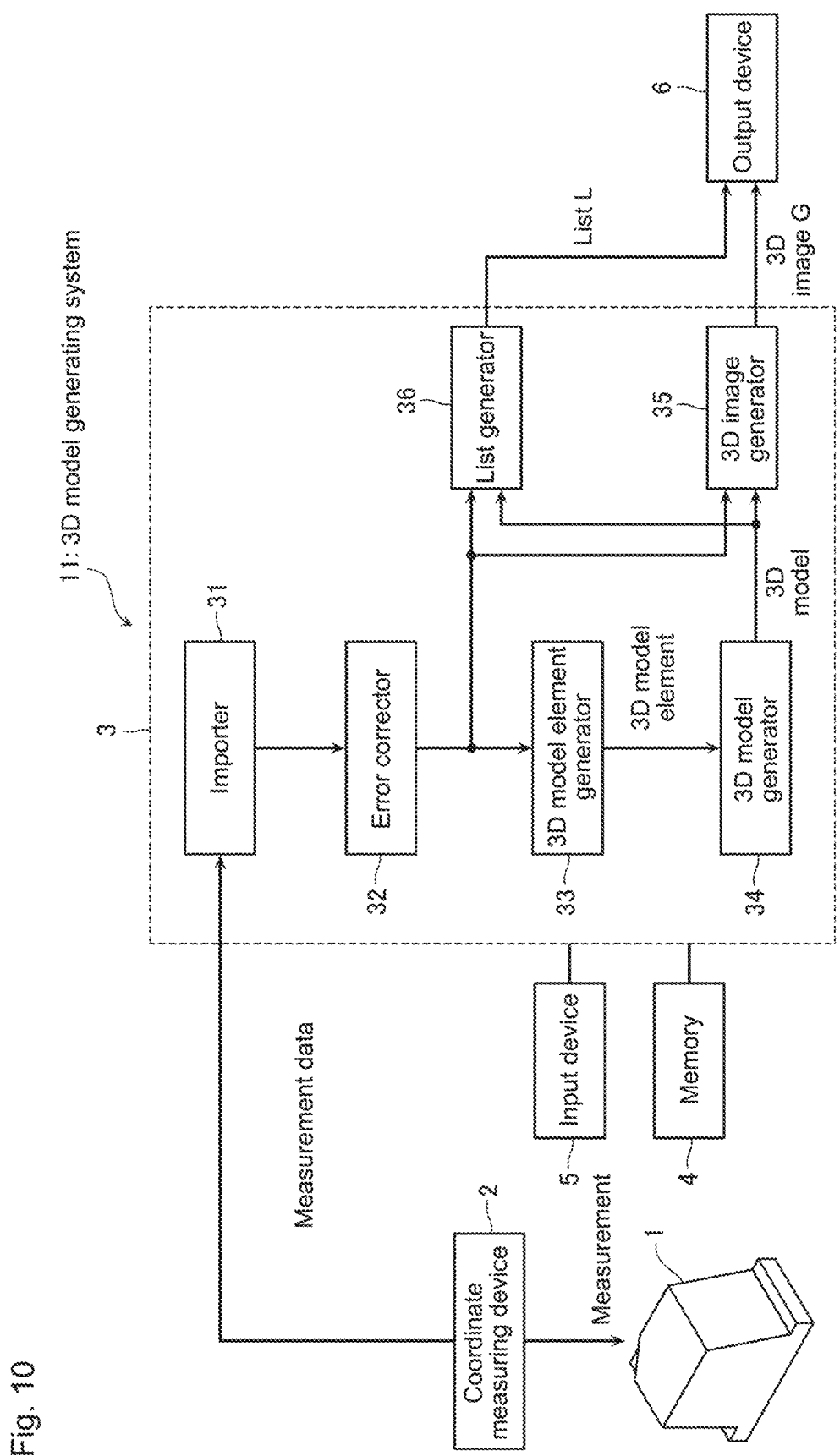
FIG. 10 is a block diagram of a three-dimensional model generating system according to a fourth embodiment of the present invention.

Next, a three-dimensional model generating method according to a fourth embodiment of the present invention is described with reference to FIGS. 10 to 12. FIG. 10 is a block diagram of a three-dimensional model generating system 11 according to the present embodiment. In the following description, portions similar to those of the first through third embodiments are assigned the same reference numerals, and a description thereof is omitted.

As shown in FIG. 10, the three-dimensional model generating system 11 according to the present embodiment has a configuration that is basically similar to that of the three-dimensional model generating system 10 according to the first embodiment. However, the three-dimensional model generating system 11 includes an error corrector 32 correcting an inclination of a plane element. In the following, a plane on which the measured object 1 is positioned is designated a base plane, and a straight line perpendicular to the base plane is designated a base axis.

Figure 11:
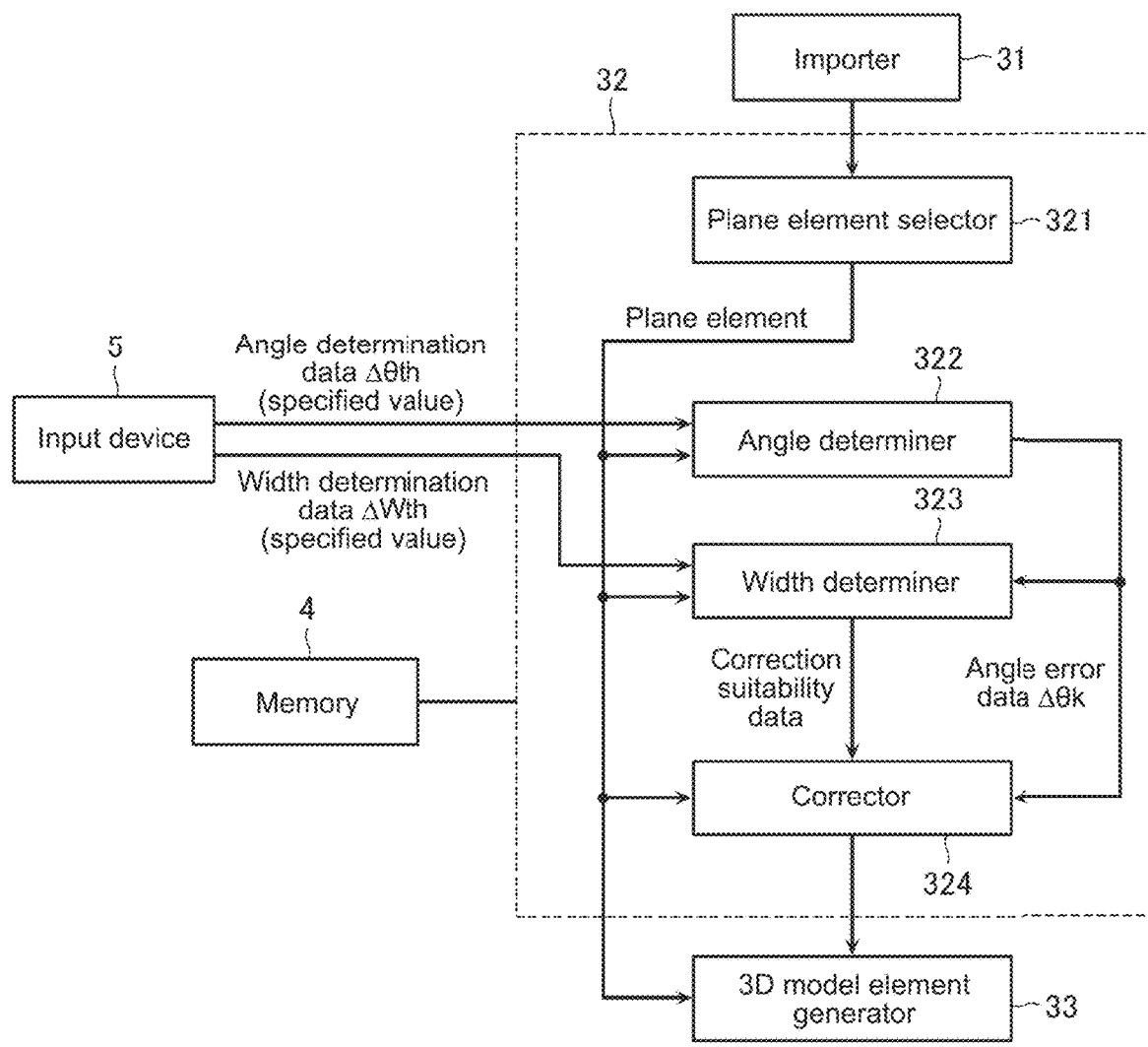
FIG. 11 is a block diagram of a configuration of an error corrector according to the fourth embodiment of the present invention.

FIG. 11 is a block diagram of the error corrector 32. As shown in FIG. 11, the error corrector 32 includes a plane element selector 321 sequentially selecting one plane element from the plane elements in the measurement data input via the importer 31; an angle determiner 322 determining an angle of inclination of the selected plane element; a width determiner 323 determining an occupied width of the plane element; and a corrector 324 correcting the inclination of the plane element in accordance with the determination results.

In a case where the selected plane element is a flat plane element, the angle determiner 322 performs angle determination determining whether an angle error formed by the base plane and a plane identified by the geometric values of the plane element is equal to or less than angle determination data $\Delta\theta th$ (specified value). In a case where the selected plane element is a cylindrical plane element, a conical plane element, a toroid plane element, or the like, the angle determiner 322 performs angle determination determining whether the angle error formed by the base axis and a center axis identified by the geometric values of the plane element is equal to or less than the angle determination data $\Delta\theta th$. As a result of the angle determination, in a case where the angle error is equal to or less than the predetermined angle determination data $\Delta\theta th$, angle error data $\Delta\theta k$ is output as a correction value.

The width determiner 323 determines the width occupied by measurement point group data, with a flat or curved plane identified by the geometric values of the selected plane element as a reference. In a case where the plane element is a flat plane, the determination using the width occupied by the measurement point group data is performed for a region where the measurement point group data is projected onto the plane element identified by the geometric values of the plane element. In a case where the plane element is a cylindrical element or a conical element, the determination using the width occupied by the measurement point group data is performed for a region where the measurement point group data is projected onto an axis of the plane element identified by the geometric values of the plane element. The width occupied by the measurement point group data is expressed by a normal direction distance from the plane element identified by the geometric values to each measurement point. The width determiner 323 determines whether the width occupied by the measurement point group data is equal to or less than width determination data $\Delta Wth$ (specified value) and outputs correction suitability data as the determination result. The angle determination data $\Delta\theta th$ and the width determination data $\Delta Wth$ can be specified ahead of time using the input device 5.

In a case where the error was determined to be equal to or less than the specified value in both the angle determination and the width determination, the corrector 324 obtains the angle error $\Delta\theta k$, corrects the plane element by the amount of the angle error $\Delta\theta k$, and outputs the corrected plane element. As a result, the plane represented by the plane element is lined up so as to be identical, parallel, or perpendicular to the base plane, or the center axis of the plane element is lined up so as to be identical, parallel, or perpendicular to the base axis. In a case where the angle error is determined to be larger than the angle determination data $\Delta\theta th$ in the angle determination, or where the occupied width is determined to be larger than the width determination data $\Delta Wth$ in the width determination, no correction of the plane element is performed.

According to this method, the error can be corrected, enabling generation of an accurate three-dimensional model. In addition, a situation can be prevented in which an intentional inclination provided to a plane by design is mistakenly identified as an error and corrected.

Figure 12:
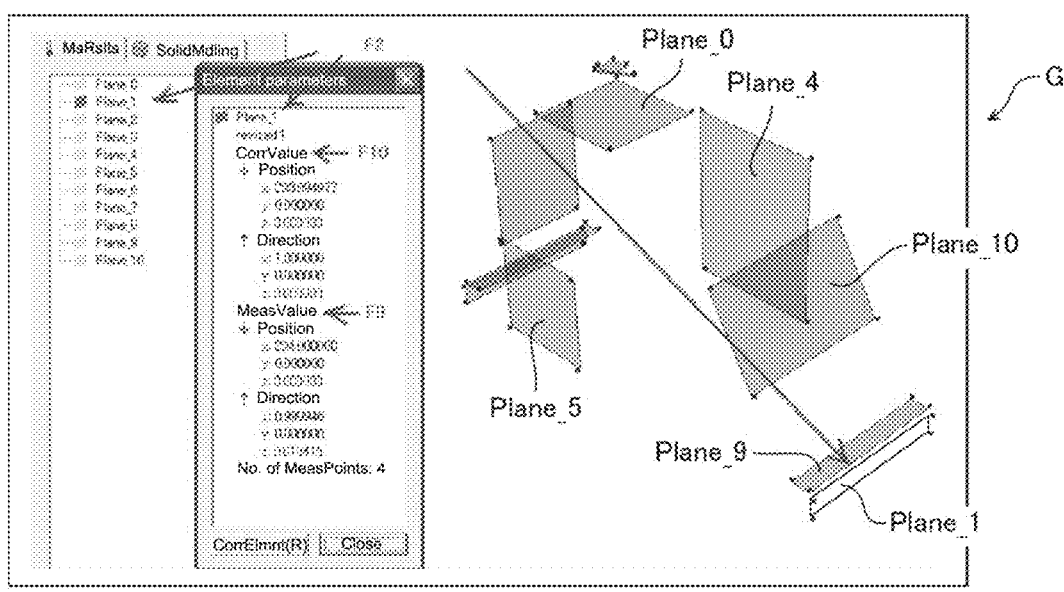
FIG. 12 illustrates another exemplary graphic output to the output device.

FIG. 12 illustrates an exemplary graphic that is output to the output device 6 and depicts, on the left portion of the figure, the list L (feature tree) of plane elements included in the measurement data and, on the right portion of the figure, the three-dimensional image G represented by the plane elements. Moreover, FIG. 12 illustrates an example in which an inclination of the plane element Plane_1 is corrected, out of the plane elements Plane_0 to Plane_10 in the measurement data.

As shown in FIG. 12, in the present embodiment, when the three-dimensional image G is being displayed, the calculator 3 displays the structural element in the three-dimensional image G corresponding to the plane element having the corrected inclination (Plane_1) in a different format than the other plane elements (Plane _ and Plane_2 to Plane_10). Furthermore, in the present embodiment, the calculator 3 displays the structural element in the list L corresponding to the plane element having the corrected inclination (Plane_1) in a different format than the other structural elements. For example, in the present embodiment, the structural element corresponding to the plane element Plane_1 in the three-dimensional image G is displayed using a different color than the other structural elements, and the structural element corresponding to the plane element Plane_1 in the list L is displayed using a different color than the other structural elements.

In this way, the plane element having the corrected inclination (Plane_1) can be favorably ascertained, and can also be restored to an original form when inclination correction is not appropriate. Accordingly, in a case where the measured object has more than a certain degree of complexity, or where the plane elements are comparatively small in the overall three-dimensional image, automatic correction can be carried out to a favorable degree while preventing unintentional correction of inclination of a plane element, and thus a three-dimensional model can be more readily generated having a desired shape and accurate dimensions based on the measurement data.

Fifth Embodiment

Figure 13:
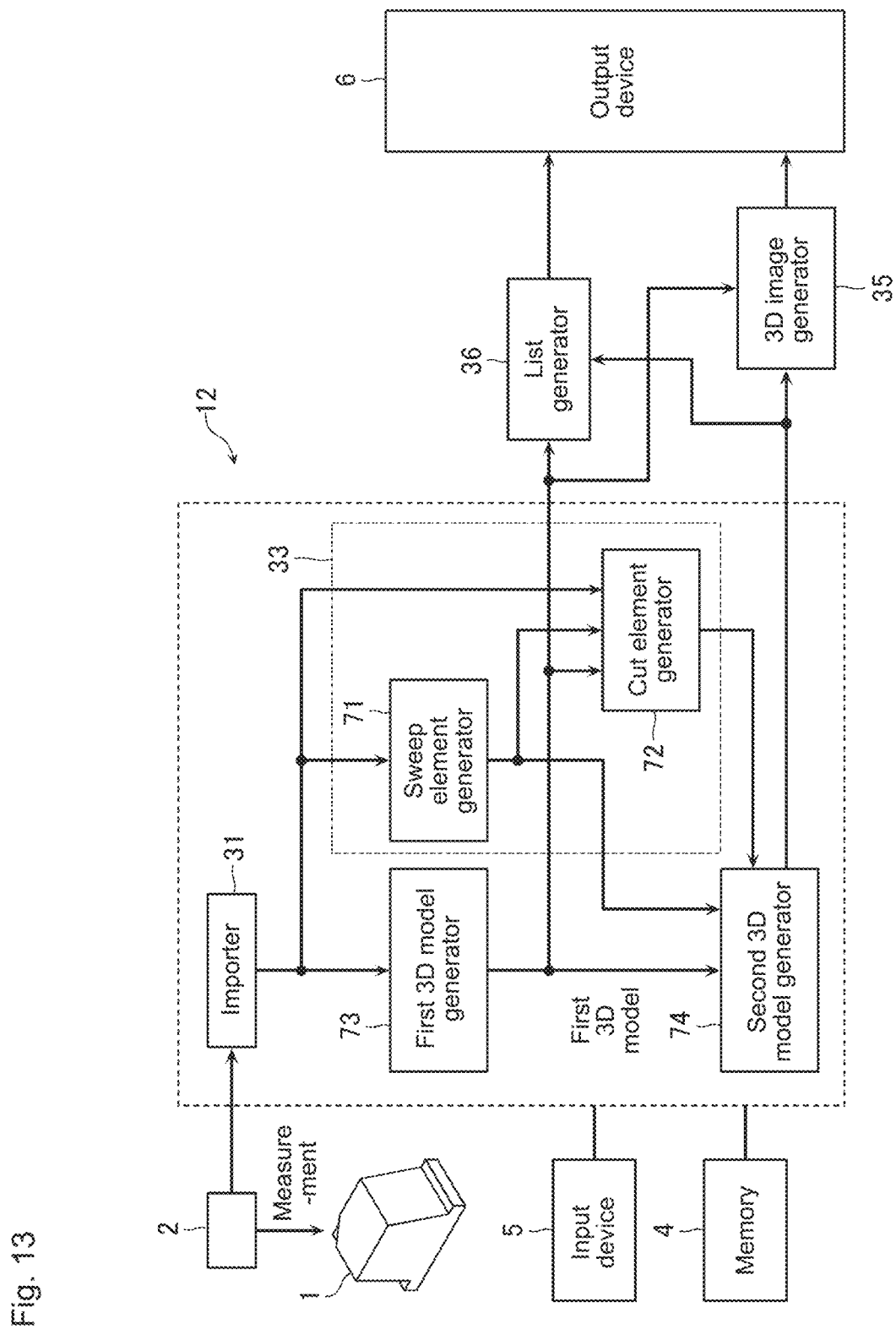
FIG. 13 is a block diagram of a three-dimensional model generating system according to a fifth embodiment of the present invention.

Next, a three-dimensional model generating method according to a fifth embodiment of the present invention is described with reference to FIG. 13. FIG. 13 is a block diagram of a three-dimensional model generating system 12 according to the present embodiment. In the following description, portions similar to those of the first through fourth embodiments are assigned the same reference numerals, and a description thereof is omitted.

As shown in FIG. 13, in the three-dimensional model generating method according to the present embodiment, a first three-dimensional model is generated automatically based on measurement data and is displayed on the output device 6. The first three-dimensional model automatically generated in this way may, for example, have a shape that differs from that of the measured object 1 in only one area. In some cases, such a difference in shape can be discovered comparatively easily by visual confirmation at this stage. Thus, the user can compare the shapes of the automatically generated first three-dimensional model and the measured object 1 and correct the first three-dimensional model as appropriate using the three-dimensional model elements, and thus a second three-dimensional model can be readily generated having a desired shape and accurate dimensions based on the measurement data.

As shown in FIG. 13, the three-dimensional model generating system 12 according to the present embodiment has a substantially similar configuration to that of the three-dimensional model generating system 10 according to the first embodiment. However, the three-dimensional model generating system 12 further includes a first three-dimensional model generator 73, which obtains information for intersections between plane elements and contour information for each plane element from the plane elements included in the measurement data and automatically generates the first three-dimensional model. In addition, the three-dimensional model element generator 33 of the three-dimensional model generating system 12 according to the present embodiment includes the sweep element generator 71 and the cut element generator 72 described above. Moreover, the three-dimensional model generating system 12 according to the present embodiment includes a second three-dimensional model generator 74 correcting the first three-dimensional model using the sweep elements, cut elements, and the like, and generating the second three-dimensional model.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A three-dimensional model generating method, comprising:
   generating, via a calculator, a first three-dimensional model based on measurement data, the measurement data including measurement point group data obtained by measuring a measured object having a plurality of plane elements, a type of the plane elements, and geometric values of the plane elements;
   generating, via the calculator, a three-dimensional sweep element, the three-dimensional sweep element representing a linear extension of the first three-dimensional model and includes a plane element of the first three-dimensional model and a plurality of candidate plane elements that were generated additionally from the first three-dimensional model, such that a number of plane elements is increased from a number of plane elements originally present in the first three-dimensional model, and the three-dimensional sweep element is based on the measurement data;
   displaying, on a display connected to the calculator, a list of plane elements included in the first three-dimensional model,
   wherein the generating of the three-dimensional sweep element includes:
      receiving, by the calculator and from an input device, a first plane element for generating the three-dimensional sweep element, among the list of the plane elements, the first plane element being a sweep base plane;
      generating, by the calculator and using the measurement data, the plurality of candidate plane elements that are not included in the list of plane elements;
      causing to display, on the display, a listing of the plurality of candidate plane elements for generating the three-dimensional sweep element;
      selecting, by the calculator, a second plane element for the three-dimensional sweep element, among the plurality of candidate plane elements;
      defining a contour line between the first plane element and the second plane element using linear intersections between the first plane element and the second plane element,
      defining a direction and a distance in which the sweep base plane is to be displaced, and
      generating the three-dimensional sweep element using the first plane element, the second plane element, the defined contour line, and the direction and distance of displacement of the sweep base plane; and
   generating, via the calculator, a second three-dimensional model based on the three-dimensional sweep element and the first three-dimensional model,
   wherein the second three-dimensional model is different from the first three-dimensional model, and includes additional planar elements more than the first three-dimensional model, and
   wherein the candidate plane elements are generated in an area at which data for the first three-dimensional model did not exist.

2. The three-dimensional model generating method according to claim 1, further comprising:
displaying, on the display, a three-dimensional image including the plane elements as the three-dimensional image.

3. The three-dimensional model generating method according to claim 1, further comprising:
displaying, on the display, a three-dimensional image of one of the first or second three-dimensional model as the three-dimensional image, and
displaying, on the display, a list of three-dimensional model elements used to generate the one of the first or second three-dimensional model and plane elements corresponding to each of the three-dimensional model elements.

4. The three-dimensional model generating method according to claim 3, further comprising displaying, on the display, when a plane element that is not used in generating of one of the first or second three-dimensional model is present, a three-dimensional image with a three-dimensional image of the unused plane element superimposed on the three-dimensional image.

5. The three-dimensional model generating method according to claim 3, wherein the displaying the list of the three-dimensional model elements used to generate one of the first or second three-dimensional model and the plane elements corresponding to each of the three-dimensional model elements, comprises displaying a plane element defining a target three-dimensional model element among the list of the three-dimensional model elements, and displaying a predetermined condition defining the target three-dimensional model element.

6. The three-dimensional model generating method according to claim 1, further comprising, when one of a predetermined structural element in the three-dimensional image and a corresponding structural element in a list is selected, displaying the selected predetermined structural element and the corresponding structural element, in a different format from remaining structural elements in the list.

7. The three-dimensional model generating method according to claim 2, further comprising:
correcting, via the calculator, an inclination of a target plane element when an angle error is equal to or less than a predetermined size when the target plane element is compared to a predetermined plane or line,
displaying, on the display, a structural element of the three-dimensional image corresponding to the target plane element having the corrected inclination in a different format from remaining structural elements in the list when the calculator displays the three-dimensional image, and
displaying, on the display, the structural element corresponding to the target plane element having the corrected inclination in a different format from the remaining structural elements on the list.

8. The three-dimensional model generating method according to claim 1, further comprising:
obtaining, via the calculator, information for intersections between the plane elements and contour information for each plane element from the plane elements and automatically generating the first three-dimensional model; and
displaying, on the display, the first three-dimensional model.

9. A three-dimensional model generating system comprising:
a calculator configured to
generate a first three-dimensional model based on measurement data, which includes measurement point group data obtained by measuring a measured object having a plurality of plane elements, a type of plane elements, and geometric values of the plane elements;
generate a three-dimensional sweep element, the three-dimensional sweep element representing a linear extension of the first three-dimensional model and includes a plane element of the first three-dimensional model and a plurality of candidate plane elements that were generated additionally from the first three-dimensional model, such that a number of plane elements is increased from a number of plane elements originally present in the first three-dimensional model, and the three-dimensional sweep element is based on the measurement data;
cause to display, on a display connected to the calculator, a list of plane elements included in the first three-dimensional model,
wherein, in the generating of the three-dimensional sweep element, the calculator:
receive, from an input device, a first plane element for generating the three-dimensional sweep element, among the list of plane elements, the first plane element being a sweep base plane;
generate, by using the measurement data, the plurality of candidate plane elements that are not included in the list of plane elements;
cause to display, on the display, a listing of the plurality of candidate plane elements for generating the three-dimensional sweep element;
select a second plane element for the three-dimensional sweep element, among the plurality of candidate plane elements;
define a contour line between the first plane element and the second plane element using linear interactions between the first plane element and the second plane element,
define a direction and a distance in which the sweep base plane is to be displaced, and
generate the three-dimensional sweep element using the first plane element, the second plane element, the defined contour line, and the direction and distance of displacement of the sweep base plane; and
generate a second three-dimensional model based on the three-dimensional sweep element and the first three-dimensional model,
wherein the second three-dimensional model is different from the first three-dimensional model, and includes additional planar elements more than the first three-dimensional model, and
wherein the candidate plane elements are generated in an area at which data for the first three-dimensional model did not exist.

10. A non-transitory computer-readable medium that stores a three-dimensional model generating program product, the three-dimensional model generating program product causing the computer to execute processes comprising:
generating, via a calculator, a first three-dimensional model based on measurement data, the measurement data including measurement point group data obtained by measuring a measured object having a plurality of plane elements, a type of the plane elements, and geometric values of the plane elements;

generating, via the calculator, a three-dimensional sweep element, the three-dimensional sweep element representing a linear extension of the first three-dimensional model and includes a plane element of the first three-dimensional model and a plurality of candidate plane elements that were generated additionally from the first three-dimensional model, such that a number of plane elements is increased from a number of plane elements originally present in the first three-dimensional model, and the three-dimensional sweep element is based on the measurement data;

displaying, on a display connected to the calculator, a list of plane elements included in the first three-dimensional model;

wherein the generating of the three-dimensional sweep element includes:

receiving, by the calculator and from an input device, a first plane element for generating the three-dimensional sweep element, among the list of the plane elements, the first plane element being a sweep base plane;

generating, by the calculator and using the measurement data, the plurality of candidate plane elements that are not included in the list of plane elements;

causing to display, on the display, a listing of the plurality of candidate plane elements for generating the three-dimensional sweep element;

selecting, by the calculator, a second plane element for the three-dimensional sweep element, among the plurality of candidate plane elements;

defining a contour line between the first plane element and the second plane element using linear intersections between the first plane element and the second plane element, defining a direction and a distance in which the sweep base plane is to be displaced, and generating the three-dimensional sweep element using the first plane element, the second plane element, the defined contour line, and the direction and distance of displacement of the sweep base plane; and generating, via the calculator, a second three-dimensional model based on the three-dimensional sweep element and the first three-dimensional model, wherein the second three-dimensional model is different from the first three-dimensional model, and includes additional planar elements more than the first three-dimensional model, and wherein the candidate plane elements are generated in an area at which data for the first three-dimensional model did not exist.

\* \* \* \* \*